United States Patent
Pattanayak et al.

(10) Patent No.: US 10,283,587 B2
(45) Date of Patent: *May 7, 2019

(54) MODULATED SUPER JUNCTION POWER MOSFET DEVICES

(71) Applicant: Vishay-Siliconix, Santa Clara, CA (US)

(72) Inventors: Deva Pattanayak, Saratoga, CA (US); Olof Tornblad, San Jose, CA (US)

(73) Assignee: VISHAY-SILICONIX, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/889,784

(22) Filed: Feb. 6, 2018

(65) Prior Publication Data

US 2018/0240869 A1 Aug. 23, 2018

Related U.S. Application Data

(63) Continuation of application No. 14/659,394, filed on Mar. 16, 2015, now Pat. No. 9,887,259.

(Continued)

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/7802* (2013.01); *H01L 29/0696* (2013.01); *H01L 29/1095* (2013.01)

(58) Field of Classification Search
CPC ............. H01L 29/0634; H01L 29/0696; H01L 29/1095; H01L 29/7802; H01L 29/66712;
(Continued)

(56) References Cited

U.S. PATENT DOCUMENTS 3,906,540 A 9/1975 Hollins
4,191,603 A 3/1980 Garbarino et al.
(Continued)

FOREIGN PATENT DOCUMENTS

CN 101180737 5/2008
CN 102194701 9/2011
(Continued)

OTHER PUBLICATIONS

"Effects on Selecting Channel Direction in Improving Performance of Sub-100 nm MOSFET's Fabricated on (110) Surface Si Substrate" Japanese Journal of Applied Physics, Part 1, vol. 43, No. 4B, Apr. 2004 pp. 1723-1728 (Nakamura et al.), XP00122768. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).
(Continued)

*Primary Examiner* — Nduka E Ojeh

(57) ABSTRACT

A semiconductor device—e.g., a super junction power MOSFET—includes a number of columns of one type of dopant formed in a region of another type of dopant. Generally speaking, the columns are modulated in some manner. For example, the widths (e.g., diameters) of some columns are greater than the widths of other columns.

17 Claims, 5 Drawing Sheets

Related U.S. Application Data

(60) Provisional application No. 62/015,941, filed on Jun. 23, 2014.

(51) Int. Cl.
*H01L 29/78* (2006.01)
*H01L 29/66* (2006.01)

(58) Field of Classification Search
CPC ........... H01L 29/7811; H01L 29/66666; H01L 29/8613
USPC ......... 257/E29.257, E29.066, 329, 334, 339, 257/E29.027, E29.262, E29.012, 256; 438/268, 288, 55
See application file for complete search history.

(56) References Cited

U.S. PATENT DOCUMENTS

| | | |
|---|---|---|
| 4,375,999 A | 3/1983 | Nawata et al. |
| 4,399,449 A | 8/1983 | Herman et al. |
| 4,532,534 A | 7/1985 | Ford et al. |
| 4,584,025 A | 4/1986 | Takaoka et al. |
| 4,593,302 A | 6/1986 | Lidow et al. |
| 4,602,266 A | 7/1986 | Coe |
| 4,620,211 A | 10/1986 | Baliga et al. |
| 4,641,174 A | 2/1987 | Baliga |
| 4,646,117 A | 2/1987 | Temple |
| 4,672,407 A | 6/1987 | Nakagawa et al. |
| 4,680,853 A | 7/1987 | Lidow et al. |
| 4,710,265 A | 12/1987 | Hotta |
| 4,782,372 A | 11/1988 | Nakagawa et al. |
| 4,799,095 A | 1/1989 | Baliga |
| 4,803,532 A | 2/1989 | Mihara |
| 4,819,044 A | 4/1989 | Murakami |
| 4,819,052 A | 4/1989 | Hutter |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,941,026 A | 7/1990 | Temple |
| 4,954,854 A | 9/1990 | Dhong et al. |
| 4,967,243 A | 10/1990 | Baliga et al. |
| 4,969,027 A | 11/1990 | Baliga et al. |
| 4,974,059 A | 11/1990 | Kinzer |
| 4,982,249 A | 1/1991 | Kim et al. |
| 5,016,066 A | 5/1991 | Takahashi |
| 5,019,526 A | 5/1991 | Yamane et al. |
| 5,021,840 A | 6/1991 | Morris |
| 5,034,338 A | 7/1991 | Neppl et al. |
| 5,034,346 A | 7/1991 | Alter et al. |
| 5,055,896 A | 10/1991 | Williams et al. |
| 5,072,266 A | 12/1991 | Bulucea et al. |
| 5,086,007 A | 2/1992 | Ueno |
| 5,087,577 A | 2/1992 | Strack |
| 5,111,253 A | 5/1992 | Korman et al. |
| 5,113,237 A | 5/1992 | Stengl |
| 5,156,993 A | 10/1992 | Su |
| 5,160,491 A | 11/1992 | Mori |
| 5,168,331 A | 12/1992 | Yilmaz |
| 5,171,699 A | 12/1992 | Hutter et al. |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,250,449 A | 10/1993 | Kuroyanagi et al. |
| 5,268,586 A | 12/1993 | Mukherjee et al. |
| 5,298,442 A | 3/1994 | Bulucea et al. |
| 5,316,959 A | 5/1994 | Kwan et al. |
| 5,341,011 A | 8/1994 | Hshieh et al. |
| 5,362,665 A | 11/1994 | Lu |
| 5,366,914 A | 11/1994 | Takahashi et al. |
| 5,378,655 A | 1/1995 | Hutchings et al. |
| 5,387,528 A | 2/1995 | Hutchings et al. |
| 5,396,085 A | 3/1995 | Baliga |
| 5,404,040 A | 4/1995 | Hshieh et al. |
| 5,422,508 A | 6/1995 | Yilmaz et al. |
| 5,429,964 A | 7/1995 | Yilmaz et al. |
| 5,430,315 A | 7/1995 | Rumennik |
| 5,497,013 A | 3/1996 | Temple |
| 5,521,409 A | 5/1996 | Hshieh et al. |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,597,765 A | 1/1997 | Yilmaz et al. |
| 5,602,424 A | 2/1997 | Tsubouchi et al. |
| 5,614,751 A | 3/1997 | Yilmaz et al. |
| 5,621,234 A * | 4/1997 | Kato ................ H01L 27/0251 257/339 |
| 5,648,283 A | 7/1997 | Tsang et al. |
| 5,689,128 A | 11/1997 | Hshieh et al. |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,228,700 B1 | 5/2001 | Lee |
| 6,238,981 B1 | 5/2001 | Grebs |
| 6,245,615 B1 | 6/2001 | Noble et al. |
| 6,268,242 B1 | 7/2001 | Williams et al. |
| 6,274,904 B1 | 8/2001 | Tihanyi |
| 6,277,695 B1 | 8/2001 | Williams et al. |
| 6,285,060 B1 | 9/2001 | Korec et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,380,569 B1 | 4/2002 | Chang et al. |
| 6,391,721 B2 | 5/2002 | Nakagawa |
| 6,413,822 B2 | 7/2002 | Williams et al. |
| 6,465,843 B1 | 10/2002 | Hirler et al. |
| 6,475,864 B1 | 11/2002 | Sato et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,611,021 B1 | 8/2003 | Onishi et al. |
| 6,620,691 B2 | 9/2003 | Hshieh et al. |
| 6,621,122 B2 | 9/2003 | Qu |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,794,239 B2 | 9/2004 | Gonzalez |
| 6,825,105 B2 | 11/2004 | Grover et al. |
| 6,831,345 B2 | 12/2004 | Kinoshita et al. |
| 6,836,001 B2 | 12/2004 | Yamauchi et al. |
| 6,861,701 B2 | 3/2005 | Williams et al. |
| 6,888,195 B2 | 5/2005 | Saito et al. |
| 6,903,393 B2 | 6/2005 | Ohmi et al. |
| 6,919,610 B2 | 7/2005 | Saitoh et al. |
| 6,927,451 B1 | 8/2005 | Darwish |
| 6,927,455 B2 | 8/2005 | Narazaki |

(56) References Cited

U.S. PATENT DOCUMENTS

| | | |
|---|---|---|
| 6,960,821 B2 | 11/2005 | Noble et al. |
| 6,987,305 B2 | 1/2006 | He et al. |
| 7,045,857 B2 | 5/2006 | Darwish et al. |
| 7,122,875 B2 | 10/2006 | Hatade |
| 7,161,209 B2 | 1/2007 | Saito et al. |
| 7,224,022 B2 | 5/2007 | Tokano et al. |
| 7,319,256 B1 | 1/2008 | Kraft et al. |
| 7,335,946 B1 | 2/2008 | Bhalla et al. |
| 7,348,235 B2 | 3/2008 | Fujiishi |
| 7,361,952 B2 | 4/2008 | Miura et al. |
| 7,375,029 B2 | 5/2008 | Poelzl |
| 7,397,083 B2 | 7/2008 | Amali et al. |
| 7,449,354 B2 | 11/2008 | Marchant et al. |
| 7,470,953 B2 | 12/2008 | Takaya et al. |
| 7,504,307 B2 | 3/2009 | Peake |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,601,603 B2 | 10/2009 | Yamauchi et al. |
| 7,642,178 B2 | 1/2010 | Yamauchi et al. |
| 7,659,588 B2 | 2/2010 | Husain et al. |
| 7,663,195 B2 | 2/2010 | Ohmi et al. |
| 7,700,970 B2 | 4/2010 | Saggio et al. |
| 7,704,864 B2 | 4/2010 | Hshieh |
| 7,745,883 B2 | 6/2010 | Williams et al. |
| RE41,509 E | 8/2010 | Kinzer et al. |
| 7,767,500 B2 | 8/2010 | Sridevan |
| 7,811,907 B2 | 10/2010 | Shibata et al. |
| 7,834,376 B2 | 11/2010 | Carta et al. |
| 7,910,440 B2 | 3/2011 | Ohta et al. |
| 7,910,486 B2 | 3/2011 | Yilmaz et al. |
| 7,911,020 B2 | 3/2011 | Niimura et al. |
| 7,964,913 B2 | 6/2011 | Darwish |
| 8,076,718 B2 | 12/2011 | Takaya et al. |
| 8,080,459 B2 | 12/2011 | Xu |
| 8,247,296 B2 | 8/2012 | Grivna |
| 8,334,566 B2 | 12/2012 | Tai |
| 8,367,500 B1 | 2/2013 | Xu et al. |
| 8,368,165 B2 | 2/2013 | Richieri |
| RE44,236 E | 5/2013 | Yamauchi et al. |
| 8,536,003 B2 | 9/2013 | Lin et al. |
| 8,536,004 B2 | 9/2013 | Lin et al. |
| 8,541,278 B2 | 9/2013 | Lin et al. |
| 8,541,834 B2 | 9/2013 | Nozu |
| 8,558,309 B2 | 10/2013 | Tamaki et al. |
| 8,564,088 B2 | 10/2013 | Schmidt |
| 8,575,707 B2 | 11/2013 | Tamaki et al. |
| 8,598,657 B2 | 12/2013 | Tamaki et al. |
| 8,603,879 B2 | 12/2013 | Lin et al. |
| 8,629,019 B2 | 1/2014 | Xu et al. |
| 8,633,561 B2 | 1/2014 | Husain et al. |
| 8,643,056 B2 | 2/2014 | Kimura et al. |
| 8,643,089 B2 | 2/2014 | Lee et al. |
| 8,669,614 B2 | 3/2014 | Cheng |
| 8,716,789 B2 | 5/2014 | Ono et al. |
| 8,748,973 B2 | 6/2014 | Lin et al. |
| 8,749,017 B2 | 6/2014 | Lu |
| 8,772,869 B2 | 7/2014 | Saito et al. |
| 8,786,046 B2 | 7/2014 | Tamaki et al. |
| 8,790,971 B1 | 7/2014 | Lin et al. |
| 8,796,787 B2 | 8/2014 | Tamaki et al. |
| 8,803,207 B2 | 8/2014 | Grebs et al. |
| 8,836,017 B2 | 9/2014 | Lee et al. |
| 8,847,305 B2 | 9/2014 | Toyoda et al. |
| 8,860,144 B2 | 10/2014 | Ohta et al. |
| 8,901,652 B2 | 12/2014 | Saggio et al. |
| 8,940,606 B2 | 1/2015 | Lin et al. |
| 8,963,260 B2 | 2/2015 | Lin et al. |
| 8,981,469 B2 | 3/2015 | Tamaki et al. |
| 8,987,819 B2 | 3/2015 | Tamaki et al. |
| 9,000,516 B2 | 4/2015 | Xiao |
| 9,006,822 B2 | 4/2015 | Peake et al. |
| 9,029,946 B2 | 5/2015 | Davies |
| 9,041,070 B2 | 5/2015 | Eguchi et al. |
| 9,041,101 B2 | 5/2015 | Ono et al. |
| 9,048,250 B2 | 6/2015 | Yamada et al. |
| 9,076,725 B2 | 7/2015 | Niimura |
| 9,076,887 B2 | 7/2015 | Lee et al. |
| 9,082,810 B2 | 7/2015 | Kitagawa |
| 9,093,288 B2 | 7/2015 | Tamaki et al. |
| 9,111,770 B2 | 8/2015 | Lin et al. |
| 9,129,892 B2 | 9/2015 | Toyoda et al. |
| 9,136,324 B2 | 9/2015 | Kimura et al. |
| 9,136,325 B2 | 9/2015 | Tan et al. |
| 9,166,036 B2 | 10/2015 | Tamaki |
| 9,177,866 B2 | 11/2015 | Davies |
| 9,236,460 B2 | 1/2016 | Koyama et al. |
| 9,240,464 B2 | 1/2016 | Eguchi et al. |
| 9,269,767 B2 | 2/2016 | Tamaki et al. |
| 9,281,393 B2 | 3/2016 | Ma et al. |
| 9,293,564 B2 | 3/2016 | Nishimura et al. |
| 9,306,064 B2 | 4/2016 | Wahl et al. |
| 9,312,332 B2 | 4/2016 | Lu |
| 9,349,721 B2 | 5/2016 | Saito et al. |
| 9,362,118 B2 | 6/2016 | Toyoda et al. |
| 9,362,393 B2 | 6/2016 | Sakata et al. |
| 9,368,617 B2 | 6/2016 | Hirler et al. |
| 9,379,235 B2 | 6/2016 | Tamaki et al. |
| 9,412,880 B2 | 8/2016 | Carta et al. |
| 9,419,092 B2 | 8/2016 | Carta et al. |
| 9,425,306 B2 | 8/2016 | Gao et al. |
| 9,431,249 B2 | 8/2016 | Pattanayak |
| 9,431,290 B2 | 8/2016 | Niimura |
| 9,431,481 B2 | 8/2016 | Lee |
| 9,431,550 B2 | 8/2016 | Chen et al. |
| 9,437,424 B2 | 9/2016 | Pattanayak et al. |
| 9,443,974 B2 | 9/2016 | Gao et al. |
| 9,472,403 B2 | 10/2016 | Carta et al. |
| 9,478,441 B1 | 10/2016 | Sridevan |
| 9,882,044 B2 | 1/2018 | Pattanayak |
| 2001/0005031 A1 | 6/2001 | Sakamoto et al. |
| 2001/0026006 A1 | 10/2001 | Noble et al. |
| 2001/0026989 A1 | 10/2001 | Thapar |
| 2001/0050394 A1 | 12/2001 | Onishi et al. |
| 2001/0052601 A1 | 12/2001 | Onishi et al. |
| 2002/0016034 A1 | 2/2002 | Gonzalez |
| 2002/0030237 A1 | 3/2002 | Omura et al. |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0011046 A1 | 1/2003 | Qu |
| 2003/0030092 A1 | 2/2003 | Darwish et al. |
| 2003/0085422 A1 | 5/2003 | Amali et al. |
| 2003/0193067 A1 | 10/2003 | Kim et al. |
| 2003/0201483 A1 | 10/2003 | Sumida |
| 2004/0016959 A1 | 1/2004 | Yamaguchi et al. |
| 2004/0021173 A1 | 2/2004 | Sapp |
| 2004/0021174 A1 | 2/2004 | Kobayashi |
| 2004/0056284 A1* | 3/2004 | Nagaoka ............ H01L 27/0207 257/253 |
| 2004/0108568 A1 | 6/2004 | Qu |
| 2004/0113201 A1 | 6/2004 | Bhalla et al. |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2004/0222458 A1 | 11/2004 | Hsieh et al. |
| 2004/0222461 A1 | 11/2004 | Peyre-Lavigne et al. |
| 2004/0238844 A1 | 12/2004 | Tokano et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0062124 A1 | 3/2005 | Chiola |
| 2005/0079678 A1 | 4/2005 | Verma et al. |
| 2005/0167695 A1 | 8/2005 | Yilmaz |
| 2005/0184336 A1 | 8/2005 | Takahashi et al. |
| 2005/0215011 A1 | 9/2005 | Darwish et al. |
| 2005/0266642 A1 | 12/2005 | Kubo et al. |
| 2006/0014349 A1 | 1/2006 | Williams et al. |
| 2006/0043481 A1 | 3/2006 | Yamashita et al. |
| 2006/0108635 A1 | 5/2006 | Bhalla et al. |
| 2006/0113577 A1 | 6/2006 | Ohtani |

(56) References Cited

U.S. PATENT DOCUMENTS

| | | |
|---|---|---|
| 2006/0113588 A1 | 6/2006 | Wu |
| 2006/0209887 A1 | 9/2006 | Bhalla et al. |
| 2006/0214221 A1* | 9/2006 | Challa ............... H01L 21/3065 257/328 |
| 2006/0214242 A1 | 9/2006 | Carta et al. |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0273390 A1 | 12/2006 | Hshieh et al. |
| 2006/0285368 A1 | 12/2006 | Schlecht |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0040217 A1 | 2/2007 | Saito et al. |
| 2007/0048909 A1 | 3/2007 | Sridevan |
| 2007/0138546 A1 | 6/2007 | Kawamura et al. |
| 2007/0145514 A1 | 6/2007 | Kocon |
| 2007/0155104 A1 | 7/2007 | Marchant et al. |
| 2007/0222025 A1 | 9/2007 | Husain et al. |
| 2007/0228496 A1 | 10/2007 | Rochefort et al. |
| 2007/0249142 A1 | 10/2007 | Hisanaga |
| 2007/0272977 A1 | 11/2007 | Saito et al. |
| 2007/0290257 A1 | 12/2007 | Kraft et al. |
| 2008/0042172 A1 | 2/2008 | Hirler et al. |
| 2008/0079078 A1 | 4/2008 | Noguchi et al. |
| 2008/0090347 A1 | 4/2008 | Huang et al. |
| 2008/0099344 A9 | 5/2008 | Basol et al. |
| 2008/0135931 A1 | 6/2008 | Challa et al. |
| 2008/0164515 A1 | 7/2008 | Li |
| 2008/0164517 A1 | 7/2008 | Ohta et al. |
| 2008/0173969 A1 | 7/2008 | Hebert et al. |
| 2008/0185640 A1 | 8/2008 | Nakagawa |
| 2008/0185643 A1 | 8/2008 | Hossain |
| 2008/0197407 A1 | 8/2008 | Challa et al. |
| 2008/0211020 A1 | 9/2008 | Saito |
| 2008/0246081 A1 | 10/2008 | Li et al. |
| 2008/0290403 A1 | 11/2008 | Ono et al. |
| 2009/0014792 A1 | 1/2009 | Reynes et al. |
| 2009/0020810 A1 | 1/2009 | Marchant |
| 2009/0079002 A1 | 3/2009 | Lee et al. |
| 2009/0085099 A1 | 4/2009 | Su et al. |
| 2009/0090967 A1 | 4/2009 | Chen et al. |
| 2009/0140327 A1 | 6/2009 | Hirao et al. |
| 2009/0159963 A1 | 6/2009 | Yamaguchi et al. |
| 2009/0166721 A1 | 7/2009 | Denison et al. |
| 2009/0166740 A1 | 7/2009 | Bhalla et al. |
| 2009/0206440 A1 | 8/2009 | Schulze et al. |
| 2009/0315104 A1 | 12/2009 | Hsieh |
| 2010/0006935 A1 | 1/2010 | Huang et al. |
| 2010/0025760 A1 | 2/2010 | Kawashima |
| 2010/0032791 A1 | 2/2010 | Hozumi et al. |
| 2010/0055892 A1 | 3/2010 | Poelzl |
| 2010/0059797 A1 | 3/2010 | Ngai et al. |
| 2010/0078775 A1 | 4/2010 | Mauder et al. |
| 2010/0084704 A1 | 4/2010 | Darwish et al. |
| 2010/0181606 A1 | 7/2010 | Takaishi |
| 2010/0233667 A1 | 9/2010 | Wilson et al. |
| 2010/0289032 A1 | 11/2010 | Zhang et al. |
| 2010/0311216 A1 | 12/2010 | Marchant |
| 2011/0001189 A1 | 1/2011 | Challa et al. |
| 2011/0049614 A1 | 3/2011 | Gao et al. |
| 2011/0053326 A1 | 3/2011 | Gao et al. |
| 2011/0089486 A1 | 4/2011 | Xu et al. |
| 2011/0089488 A1 | 4/2011 | Yilmaz et al. |
| 2011/0233667 A1 | 9/2011 | Tai et al. |
| 2011/0241104 A1* | 10/2011 | Willmeroth ......... H01L 29/0634 257/329 |
| 2011/0254084 A1 | 10/2011 | Terrill et al. |
| 2012/0112306 A1 | 5/2012 | Onishi |
| 2012/0187474 A1 | 7/2012 | Rexer et al. |
| 2012/0187477 A1 | 7/2012 | Hsieh |
| 2012/0241847 A1 | 9/2012 | Saito et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0273916 A1 | 11/2012 | Yedinak et al. |
| 2012/0299094 A1 | 11/2012 | Lee et al. |
| 2012/0313161 A1 | 12/2012 | Grivna et al. |
| 2012/0326229 A1 | 12/2012 | Poelzl et al. |
| 2013/0069145 A1 | 3/2013 | Kawano et al. |
| 2013/0134500 A1 | 5/2013 | Tamaki et al. |
| 2013/0140633 A1 | 6/2013 | Pattanayak |
| 2013/0187196 A1 | 7/2013 | Kadow |
| 2013/0207227 A1 | 8/2013 | Azam et al. |
| 2013/0214355 A1 | 8/2013 | Fang et al. |
| 2013/0264650 A1 | 10/2013 | Tamaki et al. |
| 2013/0277763 A1 | 10/2013 | Ohta et al. |
| 2013/0292762 A1 | 11/2013 | Blanchard |
| 2013/0307058 A1 | 11/2013 | Wahl et al. |
| 2013/0320462 A1 | 12/2013 | Tipirneni et al. |
| 2013/0334598 A1 | 12/2013 | Okumura |
| 2014/0027842 A1 | 1/2014 | Tamaki et al. |
| 2014/0027847 A1 | 1/2014 | Tamaki et al. |
| 2014/0035002 A1 | 2/2014 | Cao et al. |
| 2014/0061644 A1 | 3/2014 | Cao et al. |
| 2014/0061783 A1 | 3/2014 | Xiao |
| 2014/0110779 A1 | 4/2014 | Tamaki |
| 2014/0117445 A1 | 5/2014 | Kimura et al. |
| 2014/0159143 A1 | 6/2014 | Ma et al. |
| 2014/0191309 A1 | 7/2014 | Eguchi et al. |
| 2014/0191310 A1 | 7/2014 | Ono et al. |
| 2014/0199816 A1 | 7/2014 | Lin et al. |
| 2014/0206162 A1 | 7/2014 | Eguchi et al. |
| 2014/0206165 A1 | 7/2014 | Li et al. |
| 2014/0231912 A1 | 8/2014 | Willmeroth et al. |
| 2014/0242769 A1* | 8/2014 | Yamada ............. H01L 29/66477 438/289 |
| 2014/0284704 A1 | 9/2014 | Saito et al. |
| 2014/0291773 A1 | 10/2014 | Lin et al. |
| 2014/0299961 A1 | 10/2014 | Tamaki et al. |
| 2014/0302621 A1 | 10/2014 | Niimura |
| 2014/0312418 A1 | 10/2014 | Tamaki et al. |
| 2014/0327039 A1 | 11/2014 | Lin et al. |
| 2014/0370674 A1 | 12/2014 | Toyoda et al. |
| 2015/0054062 A1 | 2/2015 | Lin et al. |
| 2015/0054119 A1 | 2/2015 | Tan et al. |
| 2015/0076599 A1 | 3/2015 | Cho et al. |
| 2015/0097237 A1 | 4/2015 | Tamaki et al. |
| 2015/0108568 A1 | 4/2015 | Terrill et al. |
| 2015/0115286 A1 | 4/2015 | Takeuchi et al. |
| 2015/0115355 A1 | 4/2015 | Hirler et al. |
| 2015/0115358 A1 | 4/2015 | Mauder et al. |
| 2015/0116031 A1 | 4/2015 | Wahl et al. |
| 2015/0137697 A1 | 5/2015 | Cheng |
| 2015/0155378 A1 | 6/2015 | Tamaki et al. |
| 2015/0179764 A1 | 6/2015 | Okumura |
| 2015/0187913 A1 | 7/2015 | Peake et al. |
| 2015/0249124 A1 | 9/2015 | Ma et al. |
| 2015/0270157 A1 | 9/2015 | Niimura |
| 2015/0287778 A1 | 10/2015 | Tamaki et al. |
| 2015/0340231 A1 | 11/2015 | Toyoda et al. |
| 2015/0364577 A1 | 12/2015 | Nishimura et al. |
| 2015/0372078 A1 | 12/2015 | Pattanayak et al. |
| 2015/0372132 A1 | 12/2015 | Pattanayak et al. |
| 2016/0020273 A1 | 1/2016 | Woo et al. |
| 2016/0020276 A1 | 1/2016 | Lu |
| 2016/0020315 A1 | 1/2016 | Hirler |
| 2016/0035880 A1 | 2/2016 | Tamaki |
| 2016/0049466 A1 | 2/2016 | Abiko et al. |
| 2016/0056281 A1 | 2/2016 | Pattanayak |
| 2016/0079079 A1 | 3/2016 | Eguchi et al. |
| 2016/0079411 A1 | 3/2016 | Hino et al. |
| 2016/0126345 A1 | 5/2016 | Tamaki et al. |
| 2016/0133505 A1 | 5/2016 | Eguchi et al. |
| 2016/0190235 A1 | 6/2016 | Tamaki et al. |
| 2016/0225893 A1 | 8/2016 | Hirler et al. |

FOREIGN PATENT DOCUMENTS

| | | |
|---|---|---|
| DE | 3932621 | 4/1990 |
| DE | 4208695 | 9/1992 |
| DE | 102004036330 | 3/2005 |
| DE | 10343084 | 5/2005 |
| DE | 102004057792 | 6/2006 |

(56) References Cited

FOREIGN PATENT DOCUMENTS

| | | |
|---|---|---|
| DE | 112005003584 | 4/2008 |
| DE | 112006003618 | 11/2008 |
| DE | 102008032711 | 1/2009 |
| DE | 102009036930 | 3/2010 |
| EP | 0133642 | 3/1985 |
| EP | 0227894 | 7/1987 |
| EP | 0279403 | 8/1988 |
| EP | 0310047 | 4/1989 |
| EP | 0345380 | 12/1989 |
| EP | 0354449 | 2/1990 |
| EP | 0438700 | 7/1991 |
| EP | 0580213 | 1/1994 |
| EP | 0583022 | 2/1994 |
| EP | 0583023 | 2/1994 |
| EP | 0620588 | 10/1994 |
| EP | 0628337 | 12/1994 |
| EP | 0746030 | 12/1996 |
| EP | 1033759 | 9/2000 |
| EP | 1186023 | 3/2002 |
| EP | 1351313 | 10/2003 |
| EP | 1376674 | 1/2004 |
| EP | 1403914 | 3/2004 |
| FR | 2647596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| GB | 2269050 | 1/1994 |
| JP | 5658267 | 5/1981 |
| JP | 5984474 | 5/1984 |
| JP | 59141267 | 8/1984 |
| JP | 60249367 | 12/1985 |
| JP | 62176168 | 8/1987 |
| JP | 62298152 | 12/1987 |
| JP | 142177 | 2/1989 |
| JP | 1198076 | 8/1989 |
| JP | 1310576 | 12/1989 |
| JP | 0291976 | 3/1990 |
| JP | 102114646 | 4/1990 |
| JP | H03173180 | 7/1991 |
| JP | H05315620 | 11/1993 |
| JP | H06350090 | 12/1994 |
| JP | H09129877 | 5/1997 |
| JP | H09260645 | 10/1997 |
| JP | H10032331 | 2/1998 |
| JP | H10214809 | 8/1998 |
| JP | 2000091344 | 3/2000 |
| JP | 2000332246 | 11/2000 |
| JP | 2001016080 | 1/2002 |
| JP | 3273180 | 4/2002 |
| JP | 2002110978 | 4/2002 |
| JP | 2002127830 | 5/2002 |
| JP | 2002134705 | 5/2002 |
| JP | 2002190593 | 7/2002 |
| JP | 2002222950 | 8/2002 |
| JP | 2002246596 | 8/2002 |
| JP | 2002540603 | 11/2002 |
| JP | 2002368221 | 12/2002 |
| JP | 2002373988 | 12/2002 |
| JP | 2003030396 | 1/2003 |
| JP | 2003101039 | 4/2003 |
| JP | 2003515954 | 5/2003 |
| JP | 2003179223 | 6/2003 |
| JP | 2003324196 | 11/2003 |
| JP | 2004134793 | 4/2004 |
| JP | 2004522319 | 7/2004 |
| JP | 2005142240 | 6/2005 |
| JP | 2005209983 | 8/2005 |
| JP | 2005524970 | 8/2005 |
| JP | 2005268679 | 9/2005 |
| JP | 2005286328 | 10/2005 |
| JP | 2006005275 | 1/2006 |
| JP | 2006128507 | 5/2006 |
| JP | 2006310782 | 11/2006 |
| JP | 2006339558 | 12/2006 |
| JP | 2006344779 | 12/2006 |
| JP | 2007027561 | 2/2007 |
| JP | 2007042836 | 2/2007 |
| JP | 2007157799 | 6/2007 |
| JP | 2007158275 | 6/2007 |
| JP | 2007173783 | 7/2007 |
| JP | 2007189192 | 7/2007 |
| JP | 2007529115 | 10/2007 |
| JP | 2008042056 | 2/2008 |
| JP | 2008511982 | 4/2008 |
| JP | 2008171887 | 7/2008 |
| JP | 2008294214 | 12/2008 |
| JP | 2009004411 | 1/2009 |
| JP | 2009043966 | 2/2009 |
| JP | 2009117715 | 5/2009 |
| JP | 2009522807 | 6/2009 |
| JP | 2010147065 | 7/2010 |
| JP | 2010251404 | 11/2010 |
| JP | 2011003729 | 1/2011 |
| JP | 2011192824 | 9/2011 |
| JP | 2011199223 | 10/2011 |
| JP | 2011204710 | 10/2011 |
| JP | 2012104577 | 5/2012 |
| JP | 6180860 | 8/2017 |
| KR | 1020120027299 | 3/2012 |
| KR | 101315699 | 10/2013 |
| TW | 490853 | 6/2002 |
| TW | I302028 | 10/2008 |
| WO | 0065646 | 11/2000 |
| WO | 0141206 | 6/2001 |
| WO | 0199177 | 12/2001 |
| WO | 03010812 | 2/2003 |
| WO | 2004105116 | 2/2004 |
| WO | 2005065385 | 7/2005 |
| WO | 2006058210 | 1/2006 |
| WO | 2006025035 | 3/2006 |
| WO | 2006027739 | 3/2006 |
| WO | 2006126998 | 11/2006 |
| WO | 2007002857 | 1/2007 |
| WO | 2008156071 | 12/2008 |
| WO | 2010132144 | 11/2010 |
| WO | 2011031563 | 3/2011 |
| WO | 2012149195 | 11/2012 |
| WO | WO2014013888 | 1/2014 |

OTHER PUBLICATIONS

Hattori, et al.; Design of a 200V Super Junction MOSFET with N-Buffer Regions and its Fabrication by Trench Filling; Proceedings of 2004 International Symposium on Power Semiconductor Devices & ICS, Kitakyushu; 2004. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Kaeiko, et al. Semiconductor Device, English Abstract for JP 2007-189192, Published Jul. 26, 2007, Patent Abstracts of Japan, http://www19.ipdl.inpit.go.jp/PA1/cgi-bin/PA1DETAIL. (Per 37 C.F. R. 1.98d), is not submitted because this reference was previously submitted to the PTO in prior parent U.S. Appl. No. 14/659,394 to which the present application claims priority under 35 U.S.C. 120 for an earlier effective filing date.).

L. Parechanian-Allen et al., "Device Quality Growth and Characterization of (110) GaAs Grown by Molecular Beam Epitaxy", submitted to Applied Physics Letters, Nov. 1986, Lawrence Berkeley Laboratory University of California, Berkeley, California, LBL-22564. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Session I, Boston, MA, Dec. 1, 1986, Lawrence Berkeley Laboratory Jniversity of California, Berkeley, California, LBL-22577. (Per 37 C.F.R. 1.98d), is not submitted because this reference was previously submitted to the PTO in prior parent U.S. Appl. No.

(56) References Cited

OTHER PUBLICATIONS

14/659,394 to which the present application claims priority under 35 U.S.C. 120 for an earlier effective filing date.).

Y. C. Pao et al., "(110)-Oriented GaAs MESFET's", IEEE Electron Device Letters, vol. 9, No. 3, pp. 119-121, Mar. 1988. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

"SMP60N06, 60N05, SMP50N06, 50N05, N-Channel Enhancement Mode Transistors," MOSPOWER Data Book, Siliconix inc., 1988, pp. 4-423-4-426. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

A. Q. Huang, "New Unipolar Switching Power Device Figures of Merit," IEEE Electron Device Letters, vol. 25, No. 5, May 2004, pp. 298-301. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Antognetti, "Power Integrated Circuits: Physics, Design, and Applications," McGraw-Hill Book Co., 1986, pp. 3.14-3.27, Dec. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Baliga, "Modern Power Devices", A Wiley-Interscience Publication, John Wiley & Sons, Inc., 1987, pp. 62-131. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Barbuscia et al., "Modeling of Polysilicon Dopant Diffusion for Shallow-Junction Bipolar Technology", IEDM, 1984, pp. 757-760, No Month. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Chang et al., "Vertical FET Random-Access Memories With Deep Trench Isolation," IBM Technical Disclosure Bulletin, vol. 22, No. 8B, Jan. 1980, pp. 3683-3687. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

D. Jaume et al, "High-Voltage Planar Devices Using Field Plate and Semi-Resistive Layers", IEEE Trans. on Electron Devices, vol. 38, No. 7, Jul. 1991, pp. 1681-1684. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Deboy et al., "A new generation of high voltage MOSFETs breaks the limit line of silicon," IEDM '98, Technical Digest, International, Dec. 1998, pp. 683-685, IEEE. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Iwamoto et al., "Above 500V class Superjunction MOSFETs fabricated by deep trench etching and epitaxial growth," Proceedings of the 17th International Symposium on Power Semiconductor Devices & ICs, May 23-26, 2005, pp. 31-34, IEEE. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Kim et al.,"New Power Device Figure of Merit for High-Frequency Applications," Proceedings of 1995 International Symposium on Power Semiconductor Devices & ICs, pp. 309-314. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Lorenz et al., "COOLMOS(TM)—a new milestone in high voltage Power MOS," Proceedings of the 11th International Symposium on Power Semiconductor Devices & ICs, 1999, pp. 3-10, IEEE. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

P. Ou-Yang, "Double Ion Implanted V-MOS Technology", IEEE Journal of Solid State Circuits, vol. SC-12, No. 1, Feb. 1977, pp. 3-10. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Patent Application As Filed for U.S. Appl. No. 14/663,872; Inventors: Misbah Ul Azam et al.; filed Mar. 20, 2015; "MOSFET Termination Trench,". (Per 37 C.F.R. 1.98d), is not submitted because this reference was previously submitted to the PTO in prior parent application 14/659,394 to which the present application claims priority under 35 U.S.C. 120 for an earlier effective filing date.).

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Saito et al., "A 20 m.OMEGA. .cndot. cm2 600V-class Superjunction MOSFET," Proceedings of 2004 International Symposium on Power Semiconductor Devices & ICs, pp. 459-462. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Shenoy et al., "Analysis of the Effect of Charge Imbalance on the Static and Dynamic Characteristics of the Superjunction MOSFET," Proceedings of the 11th International Symposium on Power Semiconductor Devices & ICs, 1999, pp. 99-102, IEEE. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

Takemura et al., "BSA Technology for Sub-100nm Deep Base Bipolar Transistors", Int'l Elec. Devs. Meeting, 1987, pp. 375-378. Jan. (Per 37 C.F.R. 1.98d), is not submitted because this reference was previously submitted to the PTO in prior parent U.S. Appl. No. 14/659,394 to which the present application claims priority under 35 U.S.C. 120 for an earlier effective filing date.).

\* cited by examiner

500

502
IDENTIFY A FIRST SET OF SPECIFIC LOCATIONS AT WHICH A FIRST SET OF COLUMNS IS TO BE FORMED. A FIRST WIDTH AND SHAPE IS SPECIFIED FOR EACH COLUMN IN THE FIRST SET OF COLUMNS.

▼

504
IDENTIFY A SECOND SET OF SPECIFIC LOCATIONS AT WHICH A SECOND SET OF COLUMNS IS TO BE FORMED. A SECOND WIDTH AND SHAPE IS SPECIFIED FOR EACH COLUMN IN THE SECOND SET OF COLUMNS.

▼

506
FORM THE FIRST SET OF COLUMNS AT THE FIRST SET OF LOCATIONS. EACH COLUMN IN THE FIRST SET OF COLUMNS HAS THE SAME FIRST WIDTH, WITHIN TOLERANCES.

▼

508
FORM THE SECOND SET OF COLUMNS AT THE SECOND SET OF LOCATIONS. EACH COLUMN IN THE SECOND SET OF COLUMNS HAS THE SAME SECOND WIDTH, WITHIN TOLERANCES.

Fig. 5

MODULATED SUPER JUNCTION POWER MOSFET DEVICES

RELATED U.S. APPLICATIONS

This application is a continuation of U.S. patent application Ser. No. 14/659,394, entitled "Modulated Super Junction Power MOSFET Devices," filed on Mar. 16, 2015, now U.S. Pat. No. 9,887,259, which claims priority to U.S. Provisional Application No. 62/015,941, entitled "Modulated Super Junction Power MOSFET Devices," filed on Jun. 23, 2014, both of which are hereby incorporated by reference in their entirety.

BACKGROUND

To conserve power, it is important to reduce power losses in transistors. In a metal oxide semiconductor field effect transistor (MOSFET) device, and in particular in the class of MOSFETs known as power MOSFETs, power losses can be reduced by reducing the device's on-resistance (Rdson).

Breakdown voltage provides an indication of a device's ability to withstand breakdown under reverse voltage conditions. Breakdown voltage is inversely related to Rdson, and so is adversely affected when Rdson is reduced. To address this issue, super junction (SJ) power MOSFETs, which include alternating p-type and n-type regions at the active regions of the device, were introduced. When the charges in the alternating p-type and n-type regions in a SJ power MOSFET are balanced (the charges in the p-type regions, $Q_p$, are equal to the charges in the n-type regions, $Q_n$), then breakdown voltage is at its peak value, thereby enabling the device to better withstand breakdown.

As $Q_n$ is increased relative to $Q_p$, Rdson advantageously decreases. However, an n-channel SJ power MOSFET device operated with $Q_n$ greater than $Q_p$ will suffer from lower unclamped inductive switching (UIS) ruggedness, because the field peak at breakdown will occur closer to the base of the inherent parasitic bipolar transistor. Therefore, the device is generally operated with $Q_p$ greater than $Q_n$. However, as $Q_p$ is increased relative to $Q_n$, the breakdown voltage decreases and, consequently, the breakdown voltage will be less than its peak value for an n-channel SJ power MOSFET device operated in this manner.

SUMMARY

In an embodiment according to the invention, an SJ power MOSFET device includes a number of columns of one type of dopant formed in a region of another type of dopant. For example, in an n-channel device, p-type columns are formed in an n-type region. Generally speaking, in embodiments according to the invention, the columns are modulated in some manner.

In one embodiment, the modulated columns have different widths. For example, the widths of some columns are greater than the widths of other columns. In another embodiment, the modulated columns have different cross-sectional shapes. For example, some columns may have a circular cross-section, while other columns may have a squarish cross-section or a hexagonal cross-section. In contrast, conventional SJ power MOSFET devices have columns that are the same size (width) and shape.

The modulated columns can be arranged in different ways. For example, larger-width columns can be interleaved with smaller-width columns in alternating fashion. That is, a row of larger-width columns can be next to a row of smaller-width columns, which in turn is next to another row of larger-width columns followed by another row of smaller-width columns, and so on. As another example, each narrow-width column can be surrounded by wider-width columns.

Modulation of the columns results in a combination of higher and lower amounts of charge in the columns. For example, consider an n-channel device according to the present invention. In such a device, modulating the columns results in higher values for $Q_p$ in the larger (wider) columns and lower values for $Q_p$ in the smaller (narrower) columns. However, the lowest values of $Q_p$ are greater than the charge balance value; that is, the lowest values of $Q_p$ are greater than $Q_n$. Consequently, the breakdown voltage will be higher than the breakdown voltage corresponding to the highest value of $Q_p$, but lower than the breakdown voltage corresponding to the lowest value of $Q_p$. This will lead to a lower slew rate of the breakdown voltage at the higher $Q_p$ values that provide better UIS ruggedness. Breakdown voltage and UIS ruggedness are not compromised as the field peak at breakdown will occur away from the base region of the inherent parasitic bipolar transistor because, as noted above, the lower $Q_p$ values are greater than the charge balance value. Also, process sensitivity of an SJ power MOSFET device with modulated columns is improved relative to conventional forms of such devices.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

FIG. 5 is a flowchart of a method for fabricating a device (e.g., a super junction power MOSFET device) in an embodiment according to the present invention.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

The figures are not drawn to scale, and only portions of the structures, as well as the various layers that form those structures, may be shown in the figures.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. The disclosure is presented in the context of an n-channel device, specifically an n-channel super junction (SJ) power MOSFET; however, embodiments according to the present invention are not so limited. That is, the features described herein can be utilized in a p-channel device. The disclosure can be readily mapped to a p-channel device by substituting, in the discussion, n-type dopant and materials for corresponding p-type dopant and materials, and vice versa.

Figure 1:
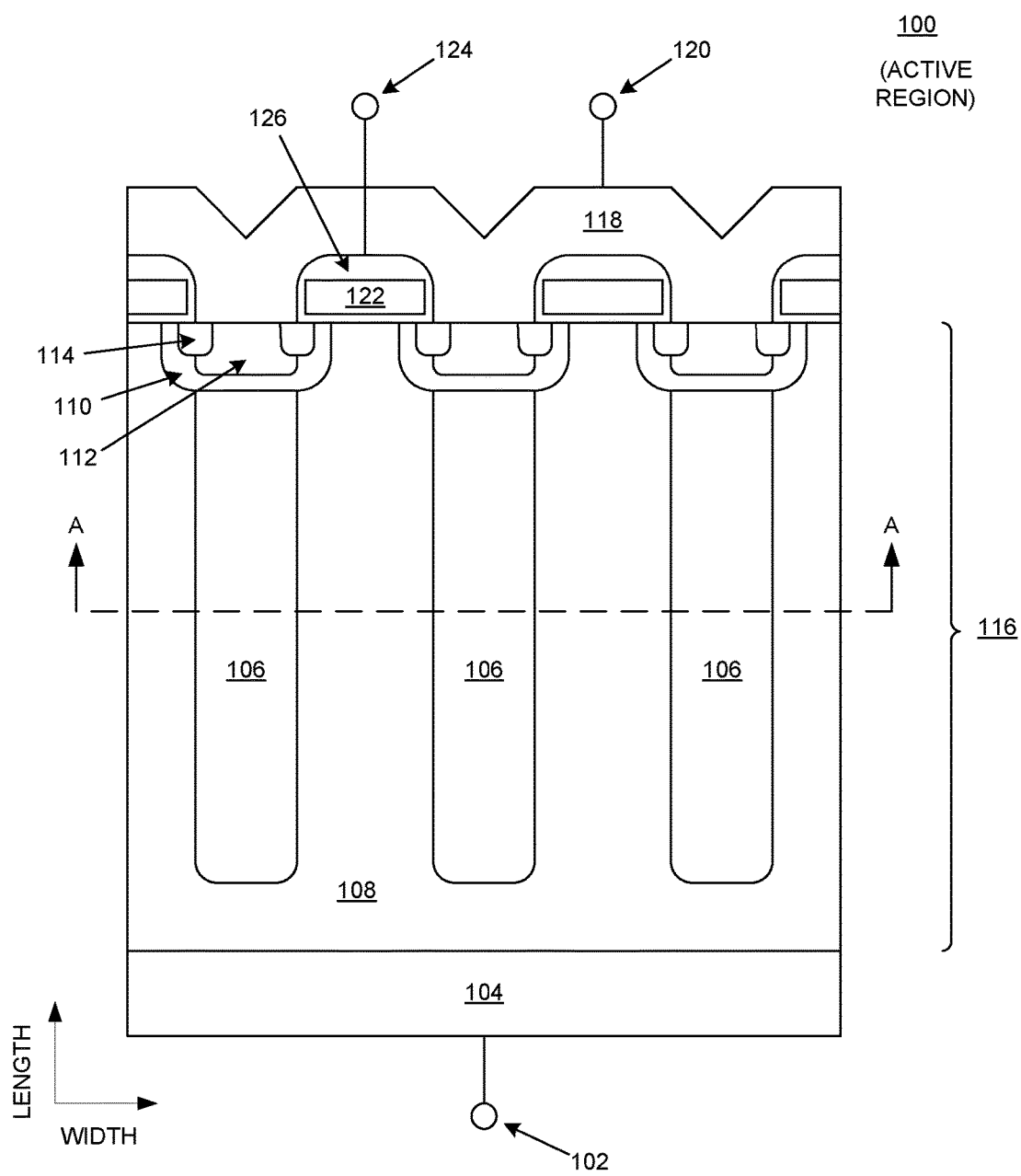
FIG. 1 is a cross-sectional view of a portion of a semiconductor device (e.g., a super junction power MOSFET device) in an embodiment according to the present invention.

FIG. 1 is a cross-sectional view of a portion of a semiconductor device 100 (e.g., an SJ power MOSFET device) in an embodiment according to the present invention. The device 100 may include elements and structures instead of or in addition to those shown and described.

Generally speaking, the device 100 has a channel of a first type dopant, and a number of columnar regions formed using a second type dopant that is different from the first type dopant, where the columnar regions/columns are in a region of the first type dopant. In the example of FIG. 1, the first type dopant is n-type and the second type dopant is p-type, and the device 100 is an n-channel device.

More specifically, the device 100 includes a drain electrode 102 on the bottom surface of an n⁺ drain layer or substrate 104. In the FIG. 1 embodiment, the device 100 also includes p⁻ drift regions or p-type columns 106 formed in n⁻ drift regions or n-type regions 108, above the substrate 104. The p-type (p⁻) columns 106 and n-type (n⁻) regions 108 form what is known as a super junction. The columns 106 and the regions 108 are located within the active region of the device 100. A termination region or termination regions (not shown) are disposed along the edges of the device 100, around the active region.

In one embodiment, the columns 106 of p-type dopant are separated from the adjacent regions 108 of n-type dopant by isolation layers or columns (e.g., a layer/column of dielectric or oxide; not shown). The isolation layers keep the p-type columns 106 and the n-type regions 108 from diffusing into one another when the structure is heated during fabrication, to prevent breakdown voltage from being adversely affected by the fabrication process.

In the FIG. 1 embodiment, there is a p-type base region 110 at the top of each of the columns 106 (in the orientation of FIG. 1). There may also be a p-type (p⁺) contact region 112 and an n-type (n⁺) source region 114 at each of the columns 106, as shown. The layer of the device 100 above the substrate 104 and that includes the elements 106, 108, 110, 112, and 114 may be referred to as the epitaxial layer 116. The epitaxial layer 116 may include elements and structures instead of or in addition to those shown and described.

In the FIG. 1 embodiment, a layer of source metal 118 is coupled to a source electrode 120, and a gate structure 122 is coupled to a gate electrode 124. The gate structure 122 is separated from its neighboring elements and structures by an isolation layer 126.

Figure 2:
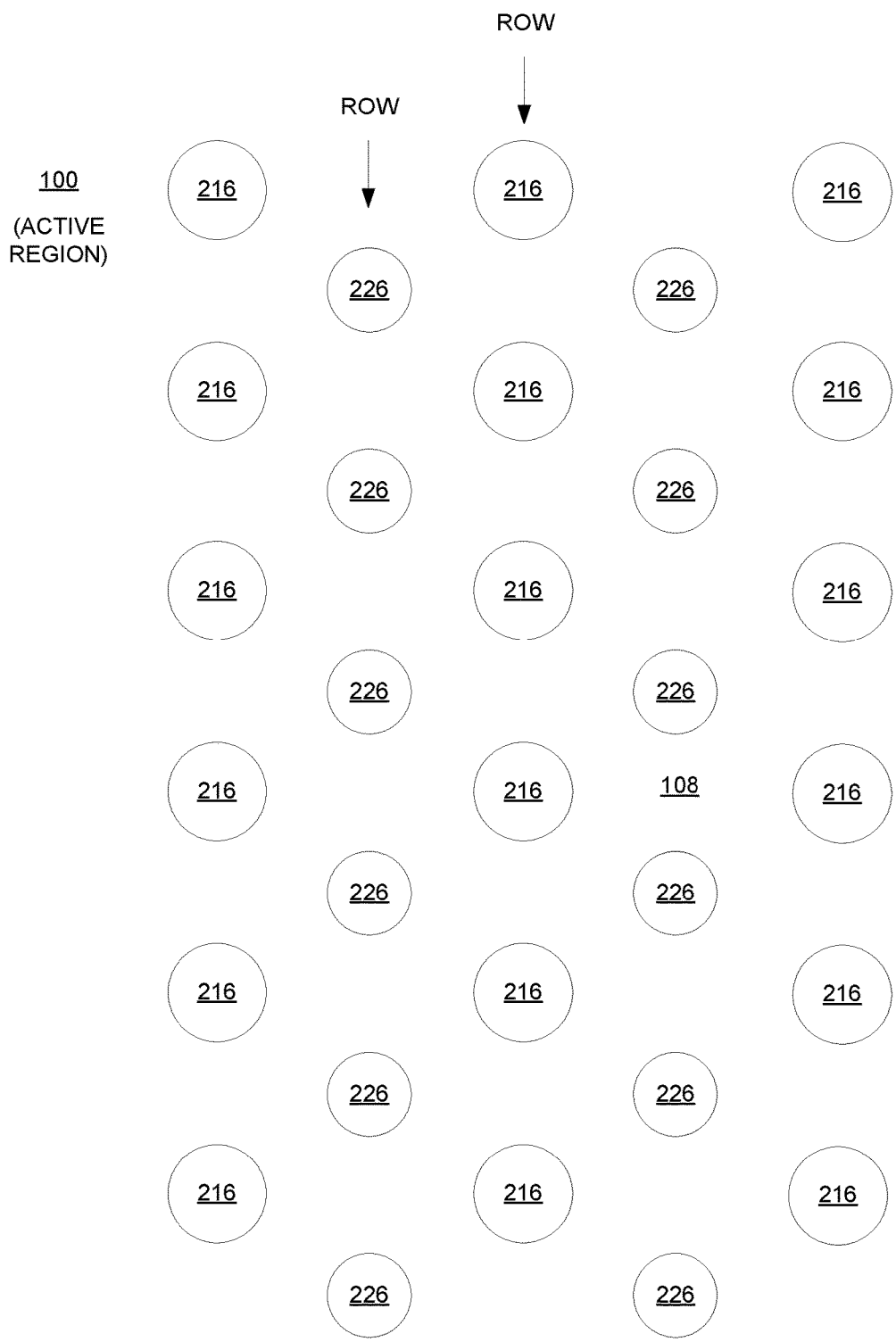
FIG. 2 is a cross-sectional view of an array of columns in a semiconductor device (e.g., a super junction power MOSFET device) in an embodiment according to the present invention.

FIG. 2 is a cross-sectional view along the cut line A-A (FIG. 1) showing an array of columns 216 and 226 in an embodiment according to the present invention. The columns 216 and 226 are examples of the columns 106 of FIG. 1. In other words, the set of columns 106 represented in FIG. 1 includes the columns 216 and 226. As described in more detail below, according to embodiments of the invention, the columns 216 and 226 are modulated. The modulated columns 216 and 226 are located in the active region of the device 100 but not in the termination region(s).

In the embodiment of FIG. 2, the columns 216 and 226 are modulated in terms of their dimensions (e.g., their widths or diameters) and thus in terms of their charge ($Q_p$) values. More specifically, the columns 216 have substantially the same first width (diameter) and the columns 226 have substantially the same second width, where the first width is different from the second width. The term "substantially the same" is used herein to mean that the there might be some differences in the widths among the columns 216 from one column to the next, but the widths of the columns 216 are within specified tolerances such as design and manufacturing tolerances. Similarly, there might be some differences in the widths of the columns 226 from one column to the next, but the widths of the columns 226 are within specified tolerances such as design and manufacturing tolerances. In other words, in the embodiment of FIG. 2, each of the columns 216 has the same width (within specified tolerances) along its entire length (below the base region 110 of FIG. 1), and each of the columns 226 has the same width (within specified tolerances) along its entire length (below the base region 110).

In the example of FIG. 2, the first width is greater than the second width. That is, the columns 216 are wider than the columns 226. Specifically, in one embodiment, the same first width is specified for each of the columns 216, and the same second width (different from the first width) is specified for each of the columns 226, and the average value of the widths of the columns 216 is greater than the average value of the widths of the columns 226. In one embodiment, a width (diameter) of 2.0 micrometers is specified for the wider columns, and a width (diameter) of 1.96 micrometers is specified for the narrower columns.

Significantly, specific locations are assigned to the columns 216 and 226 according to their respective widths. In other words, certain locations within the active region of the device 100 are identified as being the locations where wider columns (e.g., the columns 216) are to be formed. Similarly, certain locations within the active region of the device 100 are identified as being the locations where narrower columns (e.g., the columns 226) are to be formed.

In the example of FIG. 2, rows of the wider columns 216 are interleaved with rows of the narrower columns 226. More specifically, a row of the wider columns 216 is next to a row of the narrower columns 226, which is next to another row of the wider columns 216, which is next to another row of the narrower columns 226, and so on. In such an arrangement, the breakdown voltage would be around the arithmetic mean of the breakdown voltage if all the columns were wider columns and the breakdown voltage if all of the columns were narrower columns.

In general, modulation of the columns results in a combination of higher and lower amounts of charge in the columns. For example, consider an n-channel device according to the present invention. In such a device, modulating the columns results in higher values for $Q_p$ in the larger (wider) columns and lower values for $Q_p$ in the smaller (narrower) columns. However, the lowest values of $Q_p$ are greater than the charge balance value; that is, the lowest values of $Q_p$ are greater than $Q_n$. Consequently, the breakdown voltage will be higher than the breakdown voltage corresponding to the highest value of $Q_p$, but lower than the breakdown voltage corresponding to the lowest value of $Q_p$. In other words, by mixing larger columns with smaller columns, it is possible to elevate the breakdown voltage relative to the breakdown voltage that would be realized if only larger columns were used.

In Table 1, the breakdown voltages (in volts, V) and on-resistances (in ohms) are presented for examples of n-channel devices with conventional columns and for examples of n-channel devices with modulated (different width) columns. In these examples, modulated p-type columns are arranged as shown in FIG. 2, the wider columns have a diameter of 2.0 micrometers, and the narrower columns have a diameter of 1.96 micrometers. In each example, the p-type columns have a dose of 5.6E+13 ions per square centimeter. In one example, the JFet (n-type) dose is 5.0E+11 ions per square centimeter; in the other example, the JFet dose is 1.0E+12 ions per square centimeter.

TABLE 1

Example Breakdown Voltages and On-Resistances

| Type | p-Column Dose | JFet Dose | Rdson (ohms) | Breakdown Voltage (V) |
| --- | --- | --- | --- | --- |
| Modulated | 5.6E+13 | 5.0E+11 | 82.1 | 670 |
| Conventional | 5.6E+13 | 5.0E+11 | 82.4 | 620 |
| Modulated | 5.6E+13 | 1.0E+12 | 80.6 | 655 |
| Conventional | 5.6E+13 | 1.0E+12 | 80.8 | 626 |

As can be seen from Table 1, by modulating columns, the breakdown voltage has increased by 50 V in the first example and by 29 V in the second example, relative to conventional designs.

The use of modulated columns also leads to a lower slew rate of the breakdown voltage at the higher $Q_p$ values that provide better UIS ruggedness. Breakdown voltage and UIS ruggedness are not compromised as the field peak at breakdown will occur away from the base region of the inherent parasitic bipolar transistor because, as noted above, the lower $Q_p$ values are greater than the charge balance value.

Also, process sensitivity of an SJ power MOSFET device with modulated columns is improved relative to conventional forms of such devices. Arranging the different-sized columns as in FIG. 2, for example, can have the effect of smoothing of the process variations of the widths (diameters) of the columns that arise due to photolithographic limitations.

Figure 3:
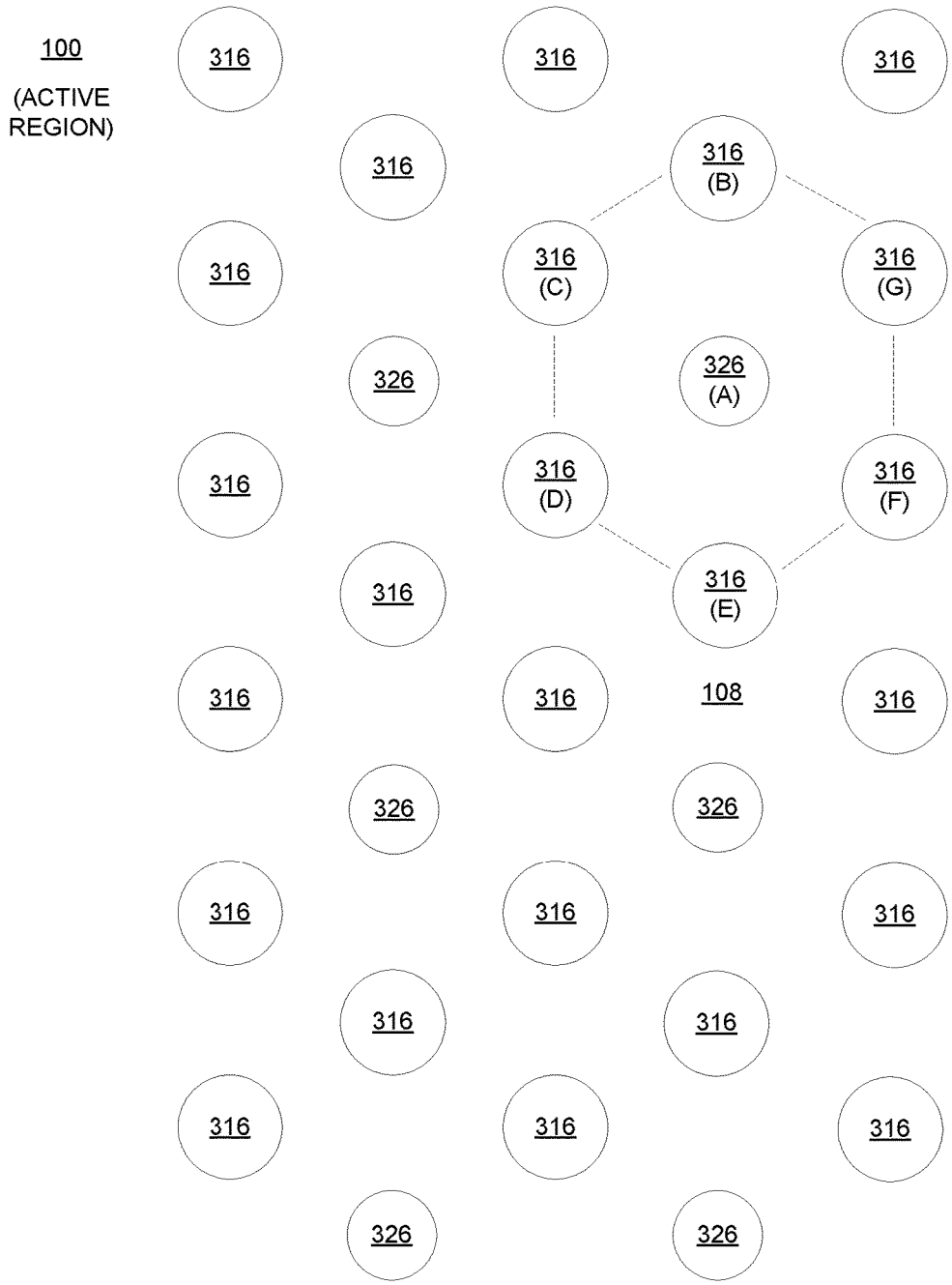
FIG. 3 is a cross-sectional view of an array of columns in a semiconductor device (e.g., a super junction power MOSFET device) in another embodiment according to the present invention.

FIG. 3 is a cross-sectional view along the cut line A-A (FIG. 1) showing an array of columns 316 and 326 in another embodiment according to the present invention. The columns 316 and 326 are examples of the columns 106 of FIG. 1. In other words, the set of columns 106 represented in FIG. 1 includes the columns 316 and 326. As described above, according to embodiments of the invention, the columns 316 and 326 are modulated. The modulated columns 316 and 326 are located in the active region of the device 100 but not in the termination region(s).

In the embodiment of FIG. 3, the columns 316 and 326 are modulated in terms of their dimensions (e.g., their widths or diameters) and thus in terms of their charge ($Q_p$) values.

More specifically, the columns 316 have substantially the same first width (diameter) and the columns 326 have substantially the same second width, where the first width is different from the second width. In the example of FIG. 3, the first width is greater than the second width. In one embodiment, a width (diameter) of 2.0 micrometers is specified for the wider columns, and a width (diameter) of 1.96 micrometers is specified for the narrower columns.

As presented above, specific locations are assigned to the columns 316 and 326 according to their respective widths. In the example of FIG. 3, each of the narrower columns 326 is surrounded by wider columns 316. For example, the narrower column labeled A is surrounded by six wider columns labeled B, C, D, E, F, and G. In essence, the columns B-G form a ring around the column A; in the example of FIG. 3, the ring is hexagonal in shape.

The arrangement of columns in FIG. 3 can also be described as follows. A first row includes only wider columns 316. Next to the first row is a second row that includes narrower columns 326 interleaved with wider columns 316. In the example of FIG. 3, every other column in the second row is a wider column—there is a narrower column between each wider column, and vice versa. Next to the second row is a third row that is similar to the first row; next to the third row is a fourth row that is similar to the second row; and so on.

Figure 4:
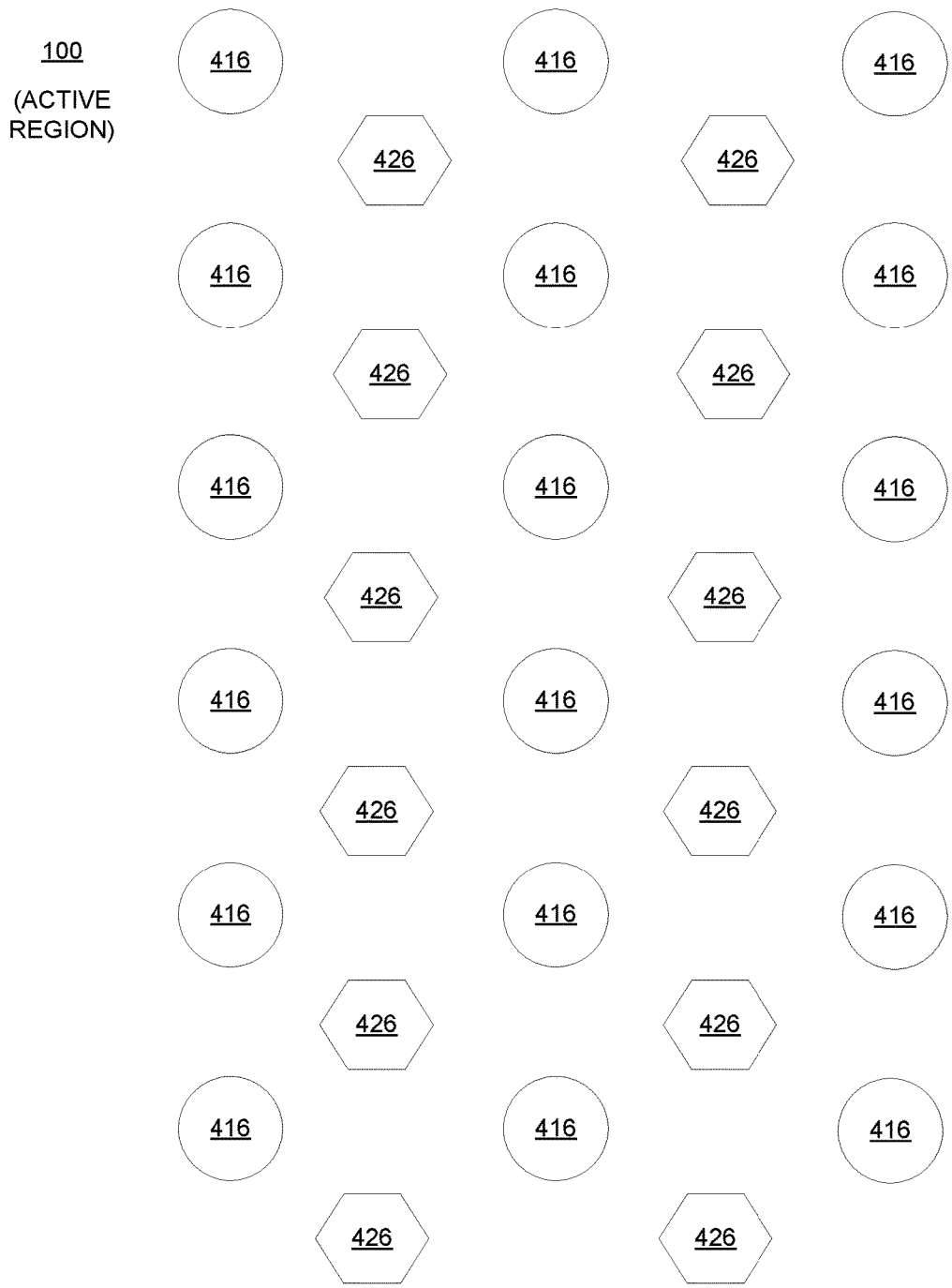
FIG. 4 is a cross-sectional view of an array of columns in a semiconductor device (e.g., a super junction power MOSFET device) in yet another embodiment according to the present invention.

Modulated columns can be arranged differently from the examples of FIGS. 2 and 3. Furthermore, the modulated columns do not need to have cross-sections that are circular in shape, as in the examples of FIGS. 2 and 3. The modulated columns may have cross-sections that are, for example, squarish or hexagonal (where the cross-sections are orthogonal to the longitudinal axes of the columns), as shown in the example of FIG. 4. Also, the modulated columns do not all have to have the same shape. For example, some columns may be circular, and other columns may be hexagonal, also shown in the example of FIG. 4.

FIG. 4 is a cross-sectional view along the cut line A-A (FIG. 1) showing an array of circular columns 416 and hexagonal columns 426 in an embodiment according to the present invention. The columns 416 and 426 are examples of the columns 106 of FIG. 1. In other words, the set of columns 106 represented in FIG. 1 includes the columns 416 and 426. As described above, according to embodiments of the invention, the columns 416 and 426 are modulated. The modulated columns 416 and 426 are located in the active region of the device 100 but not in the termination region(s).

In the embodiment of FIG. 4, the columns 416 and 426 are modulated in terms of their shape and thus in terms of their charge ($Q_p$) values. More specifically, the columns 416 are circular in shape, and the columns 426 are hexagonal in shape. In the example of FIG. 4, the arrangement of the different-shaped columns 416 and 426 is analogous to the arrangement of the different-dimensioned columns in FIG. 2. The columns 416 and 426 can be arranged in a different manner, such as one analogous to the arrangement of FIG. 3.

In general, modulated columns can be arranged according to their dimensions and/or according to their shapes. In the examples of FIGS. 2 and 3, the columns are arranged according to their dimensions (widths, diameters). If the columns 116 (FIG. 1) have different shapes, then the columns could be arranged in a manner similar to that shown in FIGS. 2 and 3, but according to their shapes, as in the example of FIG. 4. If the columns 116 (FIG. 1) have different shapes, and there are different dimensions among columns having the same shape, then the columns can be arranged according to both their shapes and their dimensions.

An SJ power MOSFET device with modulated columns can be fabricated in much the same way as a conventional SJ power MOSFET device without modulated columns, except that the processes used to control the dimensions and shapes of the columns can be modified to permit columns with different widths and/or different shapes to be formed. Thus, in one embodiment, different-sized columns and/or different-shaped columns can be formed in the same process step(s), and other process step(s) can be designed to account for the differences in the sizes and/or shapes of the columns.

FIG. 5 is a flowchart 500 of a method for fabricating a device (e.g., the device 100 of FIG. 1) in an embodiment according to the present invention. The operations described below can be performed in a different order than that described, and operations described as separate blocks may be combined and performed in the same process step (that is, in the same time interval, after the preceding process step and before the next process step). Furthermore, fabrication processes and steps may be performed along with the processes and steps discussed herein; that is, there may be a number of process steps before, in between and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

In block 502 of FIG. 5, a first set of specific locations at which a first set (type) of columns is to be formed is identified in an active region of the device. A first width and shape is specified for each column in the first set of columns.

In block 504, a second set of specific locations at which a second set (type) of columns is to be formed is identified in the active region of the device. A second width and shape is specified for each column in the second set of columns. The first width is different from the second width.

In block 506, the first set of columns is formed at the first set of locations. Each column in the first set of columns is formed with the same first width, within tolerances.

In block 508, the second set of columns is formed at the second set of locations. Each column in the second set of columns is formed with the same second width, within tolerances.

The device may be designed to include other sets (types) of columns that have different widths and/or different shapes than those in the first set and those in the second set. If so, then operations such as those in blocks 502 and 506 can be repeated for each such set.

In summary, embodiments of SJ power MOSFET devices are described. The features described herein can be used in low voltage devices as well as high voltage devices as an alternative to split-gate, dual-trench, and other conventional high voltage super junction devices.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A super junction power metal oxide semiconductor field effect transistor (MOSFET) device having a channel of first type dopant, said device comprising:
a plurality of columns, wherein said plurality of columns comprises:
a first plurality of columns comprising second type dopant that is different from said first type dopant, said first plurality of columns formed in a region comprising said first type dopant, each column in said first plurality of columns having substantially a same first width; and
a second plurality of columns comprising said second type dopant, said second plurality of columns formed in said region comprising said first type dopant, each column in said second plurality of columns having substantially a same second width;
wherein said first width is different from said second width, and wherein said second plurality of columns comprises columns that are surrounded by columns of said first plurality of columns, and wherein each column in said first plurality of columns is electrically and physically in contact with a respective base region of said second type dopant that is electrically and physically in contact with a respective contact region of said second type dopant that is physically and electrically in contact with source metal, and wherein each column in said second plurality of columns is electrically and physically in contact with a respective base region of said second type dopant that is electrically and physically in contact with a respective contact region of said second type dopant that is physically and electrically in contact with said source metal.

2. The super junction power MOSFET device of claim 1 wherein an average value of said first width across said first plurality of columns is greater than an average value of said second width across said second plurality of columns.

3. The super junction power MOSFET device of claim 1 wherein said first plurality of columns comprises a first column having a first cross-section that has a first shape and wherein said second plurality of columns comprises a second column having a second cross-section that has a second shape that is different from said first shape, said first cross-section orthogonal to an axis of said first column and said second cross-section orthogonal to an axis of said second column.

4. The super junction power MOSFET device of claim 3 wherein said first shape and said second shape are selected from the group consisting of: a circular shape; a squarish shape; and a hexagonal shape.

5. The super junction power MOSFET device of claim 1 wherein said first plurality of columns and said second plurality of columns are at an active region of said device but are outside termination regions of said device.

6. The super junction power MOSFET device of claim 1 wherein each column in said first plurality of columns has substantially a same first width along its entire length below its said respective base region, and wherein each column in said second plurality of columns has substantially a same second width along its entire length below its said respective base region.

7. A semiconductor device comprising:
a substrate comprising a first type dopant;

a super junction structure coupled to said substrate and comprising a plurality of columnar regions, said plurality of columnar regions comprising a first plurality of columnar first regions formed in a third region and a second plurality of columnar second regions formed in said third region, said third region comprising said first type dopant, said columnar first regions and said columnar second regions each comprising second type dopant that is different from said first type dopant, wherein each of said columnar first regions has a first width measured orthogonal to the longitudinal axis of said first region, and wherein each of said columnar second regions has a second width measured orthogonal to the longitudinal axis of said second region, said first width different from said second width;

wherein said second plurality of columnar second regions comprises columnar regions that are surrounded by columnar regions of said first plurality of columnar first regions, and wherein each columnar region of said first plurality of columnar first regions is electrically and physically in contact with a respective base region of said second type dopant that is electrically and physically in contact with a respective contact region of said second type dopant that is physically and electrically in contact with source metal, and wherein each columnar region of said second plurality of columnar second regions is electrically and physically in contact with a respective base region of said second type dopant that is electrically and physically in contact with a respective contact region of said second type dopant that is physically and electrically in contact with said source metal.

8. The semiconductor device of claim 7 wherein an average value of said first width across said first plurality of columnar first regions is greater than an average value of said second width across said second plurality of columnar second regions.

9. The semiconductor device of claim 7 wherein each columnar region in said first plurality of columnar first regions has a first cross-section that has a first shape and wherein each columnar region in said second plurality of columnar second regions has a second cross-section that has a second shape that is different from said first shape, said first cross-section orthogonal to axes of said columnar first regions and said second cross-section orthogonal to axes of said columnar second regions.

10. The semiconductor device of claim 9 wherein said first shape and said second shape are selected from the group consisting of: a circular shape; a squarish shape; and a hexagonal shape.

11. The semiconductor device of claim 7 wherein said first plurality of columnar first regions and said second plurality of columnar second regions are at an active region of said device but are outside termination regions of said device.

12. The semiconductor device of claim 7 wherein each of said columnar first regions has substantially a same first width along its entire length below its said respective base region, the first width measured orthogonal to the longitudinal axis of said columnar first regions, wherein each of said columnar second regions has substantially a same second width along its entire length below its said respective base region, the second width measured orthogonal to the longitudinal axis of said columnar second regions, and wherein said first width is different from said second width.

13. A semiconductor device comprising a gate, source, and drain, said semiconductor device comprising:
a substrate of said first type dopant; and
an epitaxial layer coupled to said substrate, said epitaxial layer doped with said first type dopant, said epitaxial layer having formed therein a plurality of columns, wherein said plurality of columns comprises:
a first plurality of columns comprising second type dopant that is different from said first type dopant, each column in said first plurality of columns having substantially a same first width; and
a second plurality of columns comprising said second type dopant, each column in said second plurality of columns having substantially a same second width;
wherein said first width is different from said second width, and wherein said second plurality of columns comprises columns that are surrounded by columns of said first plurality of columns, and wherein each column in said first plurality of columns is electrically and physically in contact with a respective base region of said second type dopant that is electrically and physically in contact with a respective contact region of said second type dopant that is physically and electrically in contact with source metal, and wherein each column in said second plurality of columns is electrically and physically in contact with a respective base region of said second type dopant that is electrically and physically in contact with a respective contact region of said second type dopant that is physically and electrically in contact with said source metal.

14. The semiconductor device of claim 13 wherein an average value of said first width across said first plurality of columns is greater than an average value of said second width across said second plurality of columns.

15. The semiconductor device of claim 13 wherein said first plurality of columns comprises a first column having a first cross-section that has a first shape and wherein said second plurality of columns comprises a second column having a second cross-section that has a second shape that is different from said first shape, said first cross-section orthogonal to an axis of said first column and said second cross-section orthogonal to an axis of said second column.

16. The semiconductor device of claim 13 wherein said first plurality of columns and said second plurality of columns are at an active region of said device but are outside termination regions of said device.

17. The semiconductor device of claim 13 wherein each column in said first plurality of columns has substantially a same first width along its entire length below its said respective base region, and wherein each column in said second plurality of columns has substantially a same second width along its entire length below its said respective base region.

* * * * *